United States Patent [19]

Kolev et al.

[11] 4,452,827

[45] Jun. 5, 1984

[54] METHOD FOR SURFACE MODIFICATION OF SYNTHETIC ARTIFICIAL AND NATURAL POLYMERS AND POLYMER COMPOSITIONS USING METALS, NON-METALS AND GASES

[75] Inventors: Kolyo T. Kolev; Lilly B. Peeva; Assen E. Djakov; Rossen A. Yankov; Blagoy G. Amov; Stoyan B. Stoyanov, all of Sofia, Bulgaria

[73] Assignee: Institute Za Yadreni Izsledvaniya I Yadrena Energetika, Sofia, Bulgaria

[21] Appl. No.: 538,360

[22] Filed: Sep. 30, 1983

Related U.S. Application Data

[63] Continuation of Ser. No. 486,300, Apr. 20, 1983, abandoned, which is a continuation of Ser. No. 241,357, Mar. 6, 1981, abandoned.

[30] Foreign Application Priority Data

Mar. 13, 1980 [BG] Bulgaria ................................. 47001

[51] Int. Cl.³ .............................................. B05D 7/02
[52] U.S. Cl. ......................................... 427/38; 427/40
[58] Field of Search ................................... 427/38, 40

[56] References Cited

U.S. PATENT DOCUMENTS 4,199,650  4/1980  Mirtich et al. .................... 427/38 X Primary Examiner—James R. Hoffman
Attorney, Agent, or Firm—Karl F. Ross; Herbert Dubno

[57] ABSTRACT

A low energy electron beam of ions of an element to be imparted in polymeric material is formed and accelerated, the beam being subjected to electromagnetic separation so that only a high purity stream of the ion of this element impinges upon the substrate for implantation herein.

1 Claim, No Drawings

METHOD FOR SURFACE MODIFICATION OF SYNTHETIC ARTIFICIAL AND NATURAL POLYMERS AND POLYMER COMPOSITIONS USING METALS, NON-METALS AND GASES

This application is a continuation of application Ser. No. 486,300 filed Apr. 20, 1983, itself a continuation of Ser. No. 241,357, filed Mar. 6, 1981, both now abandoned.

FIELD OF THE INVENTION

This invention relates to a method of surface modification of both synthetic, (artificial) and natural polymers and polymer compositions, using metals, non-metals and gases. This method is applicable to surface modification of the properties of synthetic polymers of polycondensation, polyaddition and monomer and polymerization types including elastomers; of both synthetic or artificial fiber fabrics; of both artificial and natural polymers such as leathers, wool, cotton, wood-cellulose materials etc; of resins and varnishes. All of the above said materials are referred to hereinafter as the "polymers".

BACKGROUND OF THE INVENTION

Methods of surface modification of polymer materials are well known and include metallization and treatments with gaseous or other substances.

The most frequently used of these methods, i.e. metallization, suffers the following principal drawbacks: poor adhesion between the metal coating and polymer surface; a requirement of both preliminary treatment of the polymer surface and application of additional fixing varnishes or other types of coating; working in a harmful environment composed of chemicals with toxic and cancerogenic action, etc.

Surface modification of polymers by non-metals has not been accomplished up to date.

Current methods of surface modification of polymer materials using gases are based either on heat treatment or electrical discharge, performed in the environment of the respective gases. The main disadvantages of these methods consist of:
(a) difficult and improper control of both the quantity of diffused gas and the properties of thus modified surface, and
(b) poor reproducibility of the process.

A process for the modification of surface properties of semiconductors and metals as well as some organic dielectrics is in current use, which is called "ion implantation", i.e. a process, in which the solid surface is subjected to a bombardment with accelerated ions of given chemical element thereby penetrating it. The process of ion implantation has not been applied to polymeric matters.

OBJECT OF THE INVENTION

The object of this invention is to provide a method for surface modification of synthetic, artificial and natural polymers and polymer compositions, using metals, non-metals and gases, this method being universal, of high efficiency and permitting materials having better properties of the modified surface and materials with new properties to be obtained thereby.

DESCRIPTION OF THE INVENTION

The method for surface modification of synthetic, artificial and natural polymers and polymer compositions using metals, non-metals and gases, according to the invention, comprises implanting accelerated ions of any chemical element in the polymer material at low energies, mainly within the range of from $10^2$ to $10^7$ electronvolts. The process of implantation is accomplished at low, room or high temperatures of the polymer material, these temperatures being within the limits of its resistance. The quantity of implanted ions (or the so called "dose of implantation") is $10^{10}$ to $10^{23}$ ions/cm$^2$. The current (i.e. density of the ion beam) is of from $10^{-8}$ A/cm$^2$ to $10^{-2}$ A/cm$^2$. The depth of penetration of the ions implanted into the polymer material is up to $10^{-6}$ m.

This method is applicable for the implantation of ions of all the elements included in the Periodic Chart into all types of polymer materials.

Accelerated ions of given chemical element are implanted into the polymer materials subject to a surface modification. For this purpose, ions of a given element (together with ions of other substances arising directly from this chemical element or from its compounds) are obtained within an ion source. The ions thus obtained are accelerated and passed through an electromagnetic separator wherein they are separated based on their masses, and the ions of a selected element are directed to the material being treated. This electromagnetic separation of the ions ensures an absolute purity of the implanted element (at an isotopic level) and makes the implanting installation universally applicable. If a high purity of the element which is implanted is not required by the technological purposes of the process, a simplification of the installation is possible by elimination of the electromagnetic separator. A high precision dosage of implantation is possible by measuring the ion beam density during the process of implantation and period of its action upon the polymer material. Depending on the energy and atomic number of the accelerated ions and the type of polymer material used, a certain depth of penetration of accelerated ions is reached and a space modified layer is formed, having a modified and qualitatively new structure.

This method can be used in the metallization of polymer surfaces by ion implantation especially for: creation of thin metal conductive layers on various plastics; coating by metallization of foil materials for capacitors; cooling by metallization of polymer surfaces having both heat and light reflective properties intended for agricultural needs, civil engineering and solar energy recovery; antistatic coatings on parts used in surgery and antiseptic coatings with medical application; coating by metallization of fabrics having heat reflective properties, intended for the preparation of clothes, sport articles, articles for everyday use and decorative use; and improvement of surface properties of wood boards and marking of securities.

Metal implantation modified polymer surfaces can serve as a stable sublayer for the application of metal coatings thereto by known methods so as to fix the metal of the coating onto the implantation modified metal sublayer rather than onto the polymer material. Moreover, the method of ion implantation modification of polymers provides for successive complex implantation of an arbitrary number of metals.

Polymer materials with their surface modified by non-metal implantation can be used for semiconductor elements (such as layers of silicon, germanium, selenium, tellurium, etc) on plastic supports; implantation of carbon to form new phases; thin heat resistance coatings based on silicon; inclusion of various non-metal admixtures having an effect on the process of ageing (i.e. photo, electrical, mechanical ageing, etc) of polyethylene modification of the surface optical properties.

The layers formed by non-metal implantation can serve as sublayers for an additional application of coatings with various substances as well as by other known methods.

Polymer materials modified by gas implantation can be used: in increasing the adhesiveness of polymer surfaces to paints, adhesive compositions and printing inks; and for improvement of the surface quality of packing materials and development of new packing materials of useful properties. Polymer materials modified by gas implantation can serve as sublayers for application of coatings by other known methods. Simultaneously, the method ensures the possibility of implanting successively an arbitrary number of elements for the gaseous state.

The advantage of the method of the invention, is that ions of the required metal or non-metal can be produced in the ion source while using an insignificant quantity (i.e. dozens of square meters of area are treated with a quantity of the order of grams) of low price salts, essentially chalcogens of low melting points, without any limit of their purity being set, due to the electromagnetic separation, which ensures an absolute purity of the element being implanted.

The other advantages of the method so proposed are as follows: a strong bond between implanted metal and polymer material is formed, ensured by internal structural bonds, where said metal forms a layer, which is not practically affected by mechanical actions (i.e. the layer does not crack or disconnect when rubbed, folded, crumpled etc.). Moreover, the adhesion force of the implanted layer is so high that the need for additional fixing varnished and coatings as well as preliminary treatment of the polymer surfaces is eliminated.

When necessary, the polymer surface can be metallized using a metal of maximal purity (at an isotopic level) so that high precision control of the quantity of metal implanted is possible by measuring the ion current during the process of implantation.

The surface electrical resistance of the polymer materials can be varied (i.e. reduced) in a wide range (of from $10^{14}$ Ohms to $10^6$ Ohms or less) according to the dose of the metal being implanted.

EXAMPLES

The following examples throw more light on the invention:

1. Aluminum ions are implanted into an impregnated fabric (Nylon 6) under the following conditions: $E=16$ KeV, $D=10^{16}$ ions/cm$^2$, $I=10$ $\mu$A/cm$^2$.
2. Tin ions are implanted into a low density polyethylene foil (Ropoten OB-03-110) under the following conditions: $E=40$ keV, $D=7.10^{16}$ ions/cm$^2$, $I=4$ $\mu$A/cm$^2$.
3. Nickelous ions are implanted into a cotton fabric under the following conditions: $E=26$ keV, $D=6.10^{16}$ ions/cm$^2$, $I=5$ $\mu$A/cm$^2$.
4. Aluminum ions are implanted into synthetic fabric (Jambolen) under the following conditions: $E=26$ keV, $D=5.10^{16}$ ions/cm$^2$, $I=2$ $\mu$A/cm$^2$.
5. Boron ions are implanted in polyethylene foil under the following conditions: $E=15$ keV, $D=2.10^{16}$ ions/cm$^2$, $I=2$ $\mu$A/cm$^2$.
6. Phosphorus ions are implanted into a polystyrene foil under the following conditions: $E=30$ keV, $D=2.10^{16}$ ions/cm$^2$, $I=1$ $\mu$A/cm$^2$.
7. Silicon ions are implanted into a synthetic fabric under the following conditions: $E=25$ keV, $D=10^{16}$ ions/cm$^2$, $I=2$ $\mu$A/cm$^2$.
8. Carbon ions are implanted into polypropylene under the following conditions: $E=25$ keV, $D=5.10^{16}$ ions/cm$^2$, $I=10$ $\mu$A/cm$^2$.
9. Oxygen ions are implanted into a polyethylene foil under the following conditions: $E=15$ keV, $D=10^{16}$ ions/cm$^2$, $I=5$ $\mu$A/cm$^2$.

In these Examples E is the energy of the accelerated ions in kiloelectronvolt, D is the dose of implantation and I is the density of the ion beam in $\mu$A/cm$^2$.

In all of the above given examples the working vacuum was of the order of $10^{-5}$ to $10^{-4}$ Torr.

Polymers modified by metal or non-metal implantation showed a reduced surface electrical resistance in the range of from $10^6$ to $10^7$ Ohms at the dosages given above.

We claim:

1. A method of implanting elements of a substance in a body of a polymeric material, comprising the steps of:
    (a) ionizing said substance and producing an ion beam of said element together with other elements derived from said substance;
    (b) accelerating said beam to provide an energy of the ions of said element and substantially $10^2$ to $10^7$ electronvolts;
    (c) subjecting said beam to electromagnetic separation whereby a substantially pure stream of ions of said element at said energy is formed; and
    (d) training said stream with an ion current of substantially $10^{-8}$ to $10^{-2}$ A/cm$^2$ onto said body to implant said ions of said element in a surface zone to a depth of up to substantially $10^{-6}$ m in an implantation dose of substantially $10^{10}$ to $10^{23}$ ions per cm$^2$, said stream being directed against said body under a pressure of $10^{-5}$ to $10^{-4}$ Torr and said element being selected from the group which consists of aluminum, tin, nickel, boron, phosphorus, silicon, carbon and oxygen.

* * * * *